United States Patent
Aljohani et al.

(10) Patent No.: US 10,983,496 B1
(45) Date of Patent: Apr. 20, 2021

(54) APPARATUS AND METHOD FOR NON-INTRUSIVE LOAD MONITORING AIDED HYBRID HIGH AND LOW FREQUENCY APPROACHES

(71) Applicant: KING ABDULAZIZ UNIVERSITY, Jeddah (SA)

(72) Inventors: Abdulah Jeza Aljohani, Jeddah (SA); Abdolmaged Alkhulaifi, Jeddah (SA)

(73) Assignee: King Abdulaziz University, Jeddah (SA)

( * ) Notice: Subject to any disclaimer, the term of this patent is extended or adjusted under 35 U.S.C. 154(b) by 0 days.

(21) Appl. No.: 17/068,947

(22) Filed: Oct. 13, 2020

(51) Int. Cl.
*G05B 19/042* (2006.01)
*G06Q 50/06* (2012.01)
(Continued)

(52) U.S. Cl.
CPC ..... *G05B 19/0428* (2013.01); *G01R 21/1333* (2013.01); *G06N 3/08* (2013.01); *G06Q 50/06* (2013.01); *G06Q 50/163* (2013.01); *G07C 9/00* (2013.01); *H02J 13/00002* (2020.01); *H02J 13/00024* (2020.01); *H02J 13/00026* (2020.01); *H04W 4/021* (2013.01); *G05B 2219/23238* (2013.01); *H02J 2310/14* (2020.01)

(58) Field of Classification Search
CPC ...... G05B 19/0428; G05B 2219/23238; G06Q 50/06; G06Q 50/163; G07C 9/00; G01R 21/1333; H02J 13/00024; H02J 13/00026; H02J 13/00002; H02J 2310/14; G06N 3/08; H04W 4/021
See application file for complete search history.

(56) References Cited

U.S. PATENT DOCUMENTS 4,858,141 A * 8/1989 Hart ............... G01R 21/1331
702/61
5,196,982 A * 3/1993 Landsberg ......... G01R 21/133
361/78

(Continued)

FOREIGN PATENT DOCUMENTS

| GB | 2475172 A | 11/2011 |
| KR | 10-2049453 B1 | 11/2019 |

OTHER PUBLICATIONS

Bejarno et al.; "Deep Latent Generative Models for Energy Disaggregation"; The Thirty-Third AAAI Conference on Artificial Intelligence, Association for the Advancement of Artificial Intelligence, 2019, pp. 850-857.

(Continued)

*Primary Examiner* — Ziaul Karim
(74) *Attorney, Agent, or Firm* — W & C IP (57) ABSTRACT

An apparatus and method are used for disaggregating and classifying energy consumption data from the overall energy consumption data of a building. Both high frequency sampling data classified by a convolutional neural network running on a cloud server and low frequency sampling data analyzed by a convolutional neural net running locally on an electric smart meter are used in the method. A control circuit switches between high and low frequency sampling modes based on the activity level of the building. Individual devices can also be controlled through a mobile application connected to the control circuit.

6 Claims, 5 Drawing Sheets
(4 of 5 Drawing Sheet(s) Filed in Color)

(51) Int. Cl.
*G06Q 50/16* (2012.01)
*G07C 9/00* (2020.01)
*G06N 3/08* (2006.01)
*H02J 13/00* (2006.01)
*H04W 4/021* (2018.01)
*G01R 21/133* (2006.01)

(56) References Cited

U.S. PATENT DOCUMENTS

| | | | |
|---|---|---|---|
| 5,483,153 A * | 1/1996 | Leeb | G01R 19/25 324/102 |
| 2014/0207298 A1 * | 7/2014 | Gupta | G05B 15/02 700/291 |
| 2016/0212506 A1 * | 7/2016 | Norwood | H02J 13/0006 |
| 2018/0348711 A1 | 12/2018 | Gupta et al. | |

OTHER PUBLICATIONS

De Baets et al.; "Applicance classification using VI trajectories and convolutional neural networks"; Energy and Buildings, vol. 158, 2018, pp. 32-36.

Gao et al.; "Demo Abstract: PLAID: a Public Dataset of High-Resolution Electrical Appliance Measurements for Load Identification Research"; BuildSys '14, Nov. 5-6, 2014, pp. 1-2.

Hart; "Nonintrusive Appliance Load Monitoring"; Proceedings fo the IEEE, vol. 80, No. 12, Dec. 1992, pp. 1870-1891.

Hassan et al.; "An Empirical Investigation of V-I Trajectory Based Load Signatures for Non-Intrusive Load Monitoring", IEEE Transactions on Smart Grid, vol. 5, No. 2, Mar. 2014, pp. 870-878.

Kahl et al.; "A Comprehensive Feature Study for Appliance Recognition on High Frequency Energy Data"; e-Energy 17, May 16-19, 2017, pp. 121-131.

Kelly et al.; "Neural NILM: Deep Neural Networks Applied to Energy Disaggregation"; ACM BuildSys '15, Nov. 4-5, 2015, entire article.

Kelly et al.; "The UK-DALE dataset, domestic appliance-level electricity demand and whole-house demand from five UK homes"; Scientific Data, Mar. 31, 2015, entire article.

Krystalakos et al.; "Sliding Window Approach for Online Energy Disaggregation Using Artificial Neural Networks"; SETN '18, Jul. 9-15, 2018, Association for Computing Machinery, entire article.

Mauch et al.; "A Novel DNN-HMM-Based Approach for Extracting Single Loads From Aggregate Power Signals", ICASSP, 2016, pp. 2384-2388.

Murray et al.; "Tranferabilitiy of Neural Network Approaches for Low-Rate Energy Disaggregation"; ICASSP, 2019, pp. 8330-8334.

Parson et al.; "Dataport and NILMTK: A Building Data Set Designed for Non-intrusive Load Monitoring"; Global SIP 2015—Symposium on Signal Processing Applications in Smart Buildings, 2015, pp. 210-214.

Rashid et al.; "Can non-intrusive load monitoring be sued for identifying an appliance's anomalous behaviour?", Applied Energy, vol. 238, 2019, pp. 796-805.

Ruano et al.; "NILM Techniques for Intelligent Home Energy Management and Ambient Assisted Living: A Review"; Energies, vol. 12, No. 2203, 2019, pp. 1-29.

Valenti et al.; "Exploiting the Reactive Power in Deep Neural Models for Non-Intrusive Load Monitoring"; 2018 International Joint Conference on Neural Networks, entire article.

Zhang et al.; "Sequence-to-point learning with neural networks for non-intrusive load monitoring"; Associated for the Advancement of Artificial Intelligence, 2018, entire article.

* cited by examiner

APPARATUS AND METHOD FOR NON-INTRUSIVE LOAD MONITORING AIDED HYBRID HIGH AND LOW FREQUENCY APPROACHES

FIELD OF THE INVENTION

The invention relates generally to non-intrusive load monitoring (NILM) of a building. Specifically, the present invention relates to a hybrid method of NILM which switches between high frequency and low frequency sampling depending on the activity level of the building.

BACKGROUND

Non-intrusive load monitoring is a method of decomposing the electrical consumption of a building down to individual appliance usage. This allows the building's occupants to better understand how best to conserve energy without installing measurement devices on each appliance. NILM can also be used to detect anomalous behavior that indicates an appliance is faulty.

Non-intrusive load monitoring has been known since the 1980's (see Hart U.S. Pat. No. 4,858,141) and since then various types of data sampling have been used. High frequency sampling takes fifty samples or more per second, whereas low frequency sampling takes less than one sample per second, often sampling at once per minute or hour. High frequency data is valuable because it can be used to analyze not just the energy used, but the current-voltage waveform of the appliances. This enables algorithms to identify appliances with greater accuracy even during periods of high activity when many appliances are overlapping. However, low frequency sampling is more common because it can be more easily analyzed with a client side smart meter and because of the availability of low frequency datasets.

High frequency data can be disaggregated with great accuracy by using a deep learning classifier such as a convolutional neural network. However, this method processes a vast amount of data, and is better conducted in a back-end cloud server rather than in a client side smart meter. Constant use of the cloud server causes bandwidth issues for the client and unnecessarily high traffic for the server. Thus, a need exists for a method and apparatus to dynamically switch between high frequency and low frequency sampling.

SUMMARY

Some aspects of the invention include an apparatus for monitoring power consumption of individual appliances. The apparatus includes a smart meter circuit capable of measuring and collecting power level data across three electrical supply phases and compatible with three-phase services. The apparatus also includes a control circuit capable of data handling, switching between high frequency sampling and low frequency sampling modes. The control circuit is also configured for sending data to a cloud based server, connecting to a wi-fi router, controlling devices connected to the wi-fi router, and controlling a secure communication between a mobile application, the cloud based server, and the smart meter circuit.

Other aspects of the invention include methods for assessing the energy consumption signatures of a plurality of individual appliances in a building. Power consumption sampling is selectively performed at a high frequency during periods of high activity in a building, and is selectively performed at low frequency during periods of low activity in the building. The method involves measuring the number of appliance activation or deactivation events over a given time; measuring the number of occupants of the building; and using a machine learning algorithm to identify high activity times of day. During high activity periods, a cloud based server receives the high frequency sampling data. The high frequency sampling data is processed with a convolutional neural network to disaggregate the energy consumption signatures of individual appliances. During low activity periods, a client side smart meter receives low frequency sampling data. The low frequency sampling data is processed with a convolutional neural network to predict the midpoint energy consumption of individual appliances.

In order to solve the problem of high resource costs associated with processing vast amounts of high frequency data in a cloud based server, the present invention employs a dual model hybrid approach. The invention measures high frequency data only during periods of high activity in the building and returns to measuring low frequency data during low activity periods. By doing this, the invention minimizes bandwidth and server traffic while maintaining a high level of accuracy when classifying appliances.

The low frequency data is processed on the client side smart meter by a convolutional neural network (CNN). The CNN takes a sequence of data from the collected low frequency data and predicts the midpoint consumption data of each target appliance. By sliding over the aggregated data, the CNN covers all points in the disaggregated signal. Typically, low frequency disaggregation algorithms only analyze active power, which is the actual power consumed as measured in watts. However, reactive power, the wasted power resulting from inductive and capacitive loads, may also be used.

The high frequency data is sent to and processed in a cloud based server by a convolutional neural network. This CNN uses voltage-current (VI) trajectory data extracted from the high frequency data. VI trajectory is a wave shape feature that is based on the mutual trajectory of instantaneous voltage and current wave-forms. The CNN takes the VI trajectory data as weighted pixelated VI images and outputs disaggregated data classified as individual appliances.

The present invention determines when to switch between high frequency and low frequency sampling modes based on three factors. The first factor used is the number of activation or deactivation events in a given period of time. Because activation and deactivation events require high frequency sampling, this factor prevents server and bandwidth resources from being wasted while ensuring that these events are accurately analyzed. The second factor is the number of occupants currently in the building, as measured by the number of mobile phone connections to the building's wireless network. Because more occupants correlates with higher appliance usage, this factor ensures that overlapping devices will be measured with high frequency sampling, while sparse device usage will be measured with low frequency sampling. The third factor is the time of day. Building occupants will naturally have different patterns dictating when they use appliances most frequently. The present invention uses a machine learning algorithm to learn these patterns and output times of day that are most likely to have high appliance activity.

The three factors described above are used in conjunction to determine whether the building is in a state of high activity or low activity. When the activity level rises above a specified threshold, the control circuit begins high frequency sampling and sends the high frequency data to a cloud based server. When the activity level falls below a specified threshold, the control circuit returns to low frequency sampling, and the low frequency data is processed locally on the control circuit.

The apparatus of the present invention comprises two circuits: a smart meter circuit and a control circuit.

The smart meter circuit preferably is a polyphase multi-function energy metering integrated circuit. It is capable of collecting high and low frequency electric consumption data across three electrical supply phases. It is preferably compatible with 3-phase services such as three or four wire (delta or wye) systems.

The smart meter circuit is integrated with the control circuit.

The control circuit is capable of choosing between high and low frequency modes, handling data, sending data to the cloud based server, connecting to a wi-fi router, connecting to a mobile application and controlling wi-fi connected devices. These connections allow users of the mobile application to monitor the energy consumption of individual appliances. The connections also allow users to control appliances and observe the impact of their changes on power consumption.

BRIEF DESCRIPTION OF THE DRAWINGS

The patent or application file contains at least one drawing executed in color. Copies of this patent or patent application publication with color drawings will be provided by the Office upon request and payment of the necessary fee.

DETAILED DESCRIPTION

The necessity of saving energy for reducing the electricity bills or to reduce the $CO_2$ emissions from houses has increased over the years. Recent studies showed that the best method of saving energy is to provide the user with detailed information regarding the consumption of the appliances that are being used in his resident. This in turn will provide the user the information needed to tack effective action in regarding to reducing his power consumption. However, to provide such detailed information one must install a sub-meter to each appliance in his household. This approach can be expensive and hard to manage multiple meters monitoring and collecting data at the same time. New approaches were developed that use machine learning aided algorithms that can detect the consumption of the individual appliances from a single meter that monitors the whole household power consumption. However, these approaches do not scale well across different houses which, in turn, cause a degradation in its prediction accuracy. Also, some approaches rely only on high frequency data which results in a huge data sample to process and to send to the backend server which demands powerful hardware to be used with the meters to be able to process and analyze the data.

Energy disaggregation (also called non-intrusive load monitoring NILM) is the method of decomposing the electrical consumption of the whole household down to individual appliance usage. Developing such methods will allow household occupants to understand the consumption of each appliance and to take effective action on reducing their power consumption, as has been shown that reporting appliance consumption can lead occupants to reduce power consumption by as much as 15%. Non-intrusive load monitoring can also be used to detect anomaly behavior of some appliances which can lead to the detection of faulty appliances.

Figure 1:
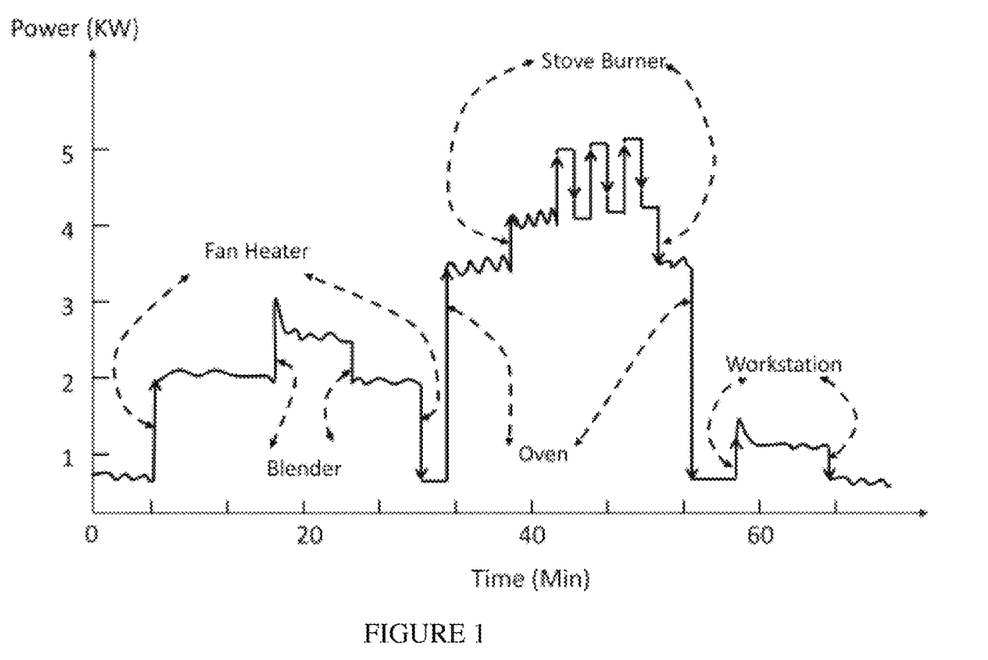
FIG. 1 is a graph showing appliance operational patterns in terms of power use of individual appliances over time.

There are two main approaches to energy disaggregation, using low frequency sampling and high frequency sampling. Low frequency sampling are data that are collected less than 1 hz i.e. 1 sample per second. Using the low frequency aggregated time series data, one can detect appliance operational patterns as illustrated in FIG. 1 (copied from G. W. Hart, "Nonintrusive appliance load monitoring," Proceedings of the IEEE, vol. 80, pp. 1870-1891, December 1992) and in some cases detect their activation as well. The availability of many public datasets also accelerated the research in the low frequency domain, as can be seen in Table 1 (copied from O. Parson, G. Fisher, A. Hersey, N. Batra, J. Kelly, A. Singh, W. Knottenbelt, and A. Rogers, "Dataport and nilmtk: A building data set designed for non-intrusive load monitoring," in 2015 IEEE Global Conference on Signal and Information Processing (GlobalSIP), pp. 210-214, December 2015).

TABLE 1

| Data set | Institution | Location | Duration per house | Number of houses | Appliance sample frequency | Aggregate sample frequency |
| --- | --- | --- | --- | --- | --- | --- |
| REDD (2011) | MIT | MA, USA | 3-19 days | 6 | 3 sec | 1 sec & 15 kHz |
| BLUED (2012) | CMU | PA, USA | 8 days | 1 | N/A* | 12 kHz |
| Smart* (2012) | UMass | MA, USA | 3 months | 3 | 1 sec | 1 sec |
| HES (2012) | DECC, DEFRA, EST | UK | 1 or 12 months | 251 | 2 or 10 min | 2 or 10 min |
| AMPds 2 (2013) | Simon Fraser University | BC, Canada | 2 years | 1 | 1 min | 1 min |
| iAWE (2013) | IIT Delhi | Delhi, India | 73 days | 1 | 1 or 6 sec | 1 sec |
| UK-DALE (2014) | Imperial College | London, UK | 3-26 months | 5 | 6 sec | 1-6 sec & 16 kHz |
| ECO (2014) | ETH Zurch | Switzerland | 8 months | 6 | 1 sec | 1 sec |

TABLE 1-continued

| Data set | Institution | Location | Duration per house | Number of houses | Appliance sample frequency | Aggregate sample frequency |
|---|---|---|---|---|---|---|
| GREEND (2014) | Alpen-Adria-U. Klagenfurt | Italy & Austria | 12 months | 9 | 1 sec | N/A |
| SustData (2014) | University of Madeira | Madeira, Portugal | 5-21 months | 50 | N/A | 50 Hz |
| Dataport (2014) | Pecan Street Inc | TX, USA | up to 3.25 years | 722 | 1 min | 1 min |
| DRED (2015) | TU Delft | Netherlands | 2 months | 1 | 1 sec | 1 sec |

Figure 2:
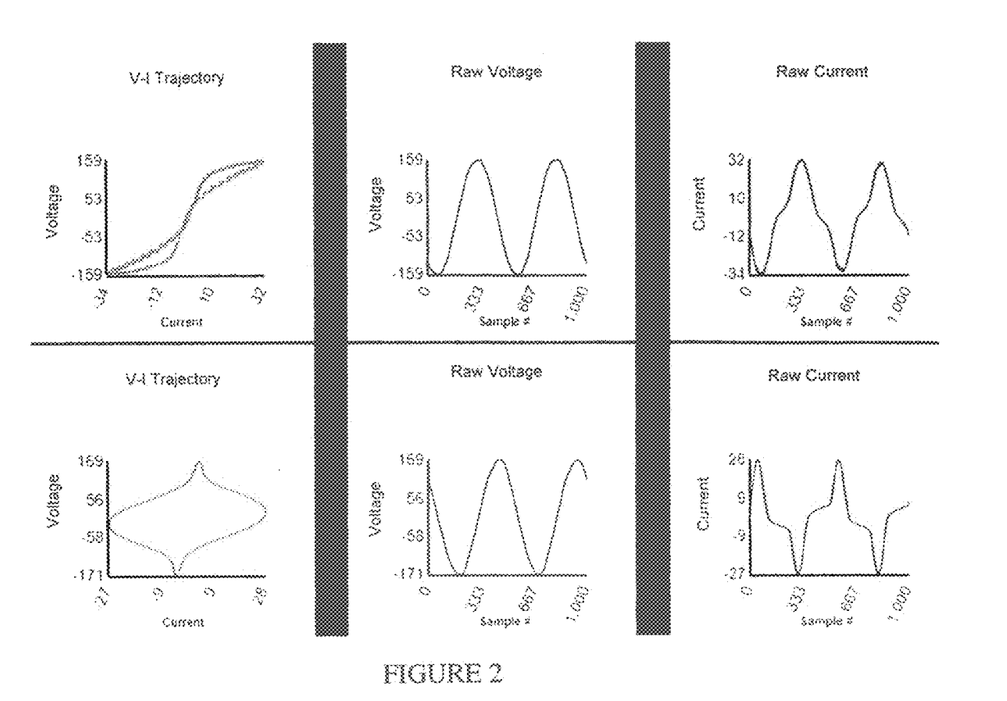
FIG. 2 are graphs showing the current, voltage and V-I trajectory of a vacuum (top) and a microwave (bottom), where the trajectories were created using PLAID dataset.

Another approach to NILM is the high frequency sampling rate which are the data collected at more than 50 Hz. High frequency measurements allow the analysis of not just the energy used, but also the analysis of the structure of the current-voltage waveform itself. One example of an approach is the V-I trajectory method described in L. De Baets, J. Ruyssinck, C. Develder, T. Dhaene, and D. Deschrijver, "Appliance classification using vi trajectories and convolutional neural networks," Energy and Buildings, vol. 158, pp. 32-36, 2018. Using this method one captures the current and voltage during the on/off event for a small period in milliseconds, and then classification is applied on the V-I trajectory which can be acquired by plotting the voltage against the current as can be seen in FIG. 2. While these type of approaches achieve better results than low frequency sampling, it's harder to be implemented due to the hardware requirement that can measure in high sampling rate. Several high frequency techniques have been proposed, including: total harmonic distortion (THD), Wavelet Analysis, and Active-Reactive Power based (see, e.g., M. Kahl, A. Ul Haq, T. Kriechbaumer, and H.-A. Jacobsen, "A comprehensive feature study for appliance recognition on high frequency energy data," in Proceedings of the Eighth International Conference on Future Energy Systems, pp. 121-131, 2017).

In the practice of the present application, a hybrid low-frequency and high-frequency system is used which judiciously selects the best algorithm according to the real-time household electricity usage. To elaborate a little, a convolutional neural network (CNN) algorithm is employed when less electricity usage is used, while a deep learning-VI trajectory based technique is invoked when high electricity activity is encountered. The hardware used has the capability of sensing both the current and voltage in high frequency. Additionally, the described system can be integrated with a wide range of smart home internet of things (IoT)-based systems, such as smart plugs and universal IRs. Hence, in addition to collecting information at two different periods of usage, the system may also be used for controlling a house's appliances in ways which may lead to reducing the energy consumption.

Recently, deep learning techniques have been widely used in solving the low-frequency-based NILM problem, due to their capabilities of extracting features and patterns (see, e.g., D. Murray, L. Stankovic, V. Stankovic, S. Lulic, and S. Sladojevic, "Transferability of neural network approaches for low-rate energy disaggregation," in ICASSP 2019-2019 IEEE International Conference on Acoustics, Speech and Signal Processing (ICASSP), pp. 8330-8334, May 2019; J. Kelly and W. Knottenbelt, "Neural nilm: Deep neural networks applied to energy disaggregation," in Proceedings of the 2Nd ACM International Conference on Embedded Systems for Energy-Efficient Built Environments, BuildSys '15, (New York, N.Y., USA), pp. 55-64, ACM, 2015; C. Zhang, M. Zhong, Z. Wang, N. H. Goddard, and C. A. Sutton, "Sequence-to-point learning with neural networks for non-intrusive load monitoring," in AAAI, 2016; M. Valenti, R. Bonfigli, E. Principi, and a. S. Squartini, "Exploiting the reactive power in deep neural models for non-intrusive load monitoring," in 2018 International Joint Conference on Neural Networks (IJCNN), pp. 1-8, July 2018; G. Bejarano, D. Defazio, and A. Ramesh, "Deep latent generative models for energy disaggregation," Proceedings of the AAAI Conference on Artificial Intelligence, vol. 33, p. 850-857, 2019; and O. Krystalakos, C. Nalmpantis, and D. Vrakas, "Sliding window approach for online energy disaggregation using artificial neural networks," in Proceedings of the 10th Hellenic Conference on Artificial Intelligence, SETN '18, (New York, N.Y., USA), pp. 7:1-7:6, ACM, 2018, each of which are herein incorporated by reference). For example, three models were proposed in Kelly et al. The first model was based on denoising autoencoder (DAE) that aims to reconstruct a clean target from the noisy data input. The second was based a convolutional neural network (CNN) trained model with the aim to estimate the start time, end time, and mean power demand. The third was based on the long short-term memory (LSTM) recurrent neural network (RNN) architecture. The study has concluded that the DAE, CNN, and LSTM-based RNN architectures performed adequately well achieving MAE score of 18, 14 and 70 in Watts respectively, when compared to non-deep learning-based techniques counterparts of combinatorial optimization (CO) and a factorial hidden Markov model (FHMM), which both had higher error, i.e., MAE of 70 and 170 respectively.

All of the approaches discussed in Kelly et al. were compared using the Domestic Appliance-Level Electricity (UK-DALE) data set, and using active power as input features. In L. Mauch and B. Yang, "A novel dnn-hmm-based approach for extracting single loads from aggregate power signals," in 2016 IEEE International Conference on Acoustics, Speech and Signal Processing (ICASSP), pp. 2384-2388, March 2016, a hybrid model based on both hidden markov model (HMM) and deep neural network (DNN) was proposed. It works by training HMM with two emission probabilities, one for the single load to be extracted and the other for the aggregate power signal. To elaborate a little, Gaussian distribution was used to model observations of the single load whereas observations of the aggregate signal are modeled with a DNN. Aiming to learn more features, MoWan He et al. (see W. He and Y. Chai, "An empirical study on energy disaggregation via deep learning," in 2016 2nd International Conference on Artificial Intelligence and Industrial Engineering (AIIE 2016), Atlantis Press, 2016/11) modified the RNN described by Kelly et al. by adding multiple parallel convolutional layers with varying filter size to detect features from aggregated signal. This idea was borrowed from the GoogleLeNet model (see, e.g., C. Szegedy, Wei Liu, Yangqing Jia, P. Sermanet, S. Reed, D. Anguelov, D. Erhan, V. Vanhoucke, and A. Rabinovich, "Going deeper with convolutions," in 2015 IEEE Conference on Computer Vision and Pattern Recognition (CVPR), pp. 1-9, June 2015) for image recognition and it's also used in natural language processing. All approaches to date tackled NILM as a sequence to sequence, given a sequence of aggregated power try to find the sequence of the appliance disaggregated power. However, in Zhang et al. a sequence to point model was proposed, where given a sequence of aggregated power find the mid-point in the appliance disaggregated power sequence. By applying a sliding window on the aggregated data, the model will cover all points in the disaggregated signal. This approach was compared to the autoencoder approach of Kelly et al., and achieved a significantly low error of MAE=15.47 across all appliances compared to 93.49 achieved by DAE counterpart.

Typically, the active power which is the actual power that is consumed measured in Watts, was the feature that was used in energy disaggregation in low frequency deep learning based approaches. However, reactive power, which is the wasted power resulting from inductive and capacitive loads measured in volt-amperes reactive with the active power, was used in Valenti et al. Two different data-sets were used, namely UK-DALE and Almanac of Minutely Power data set (AMPds), where the model of in Valenti was able to outperform the model proposed in Kelly by around 8.4% and 8.4% using UK-DALE data set and AMPds, respectively. D. Murray et al. presented a study on the transferability of neural network approaches across different data-sets. The purpose of the study was to measure the scalability of neural network approaches in large scale smart meter deployment. Two architecture were proposed, a CNN architecture with 28,696,641 parameters and a gate recurrent unit (GRU) architecture with 4,861 parameters. Evaluation was conducted across three data sets: REDD data set, UK-DALE, and REFIT, where models were trained on one data set and tested on another. Results from Murray et al. showed that the two proposed architecture performed well in the transferability test with minimal performance drop compared to training and testing on the same data set. Although Both the GRU-based network and the CNN-based network showed similar performance, the GRU-based network was easier to train and less complex due to having less trainable parameters compared to CNN. C. Shin et al. (see, C. Shin, S. Joo, J. Yim, H. Lee, T. Moon, and W. Rhee, "Subtask gated networks for non-intrusive load monitoring," Proceedings of the AAAI Conference on Artificial Intelligence, vol. 33, p. 1150-1157, 2019) explored a direction for energy disaggregation by combining regression and classification network. By multiplying regression output with classification probability to form the final estimates, their proposed model which is employing subtask gated networks (SGN), outputs the power estimation gated with on/off classification. In their experiment in REDD and UK-DALE data-sets, they reported that SGN showed 15% and 30% improved performance on average when compared to of the FHMM, and DAE, respectively.

While using high frequency sampling rate can lead to better accuracy in appliance identification, it requires high computation power to process the data locally or high bandwidth if we chose to send the data to be processed in the cloud. There has been a great progress in the field of NILM using low frequency sampling. While it can be reliable, it suffers a degradation in accuracy when there is high activity in home appliances (appliances overlapping with each other). Following this observation, this invention is designed to use both data in high and low frequency.

The inventive approach uses two models, one for high frequency data while the other is for low frequency data. The high frequency model runs in the backend cloud server due to the model depth and the complex preprocessing of the high frequency data. The low frequency model runs on the client side smart meter itself. The inventive approach switches between the high and low frequency depending on the house activity. The inventive approach uses the high frequency model only when there is high activity in the house and multiple events are detected. Once house activity is reduced, the reduction is detected and the process will switch back to the low frequency model that is operated in the client side. This is done to minimize the traffic on the high frequency model on the cloud server while also reducing the bandwidth in client and in our server duo to the size of the high frequency data required for processing on/off events. House activity is assessed by the number of appliance events in a window, number of occupants currently in the house (detected through home wireless network and their mobile phones) and time of day (learned over time for each user). Different methodologies may be employed to specify when a house or building has high activity or low activity.

Using the inventive approach, the high frequency is used to detect on/off state while the low frequency is used to detect the exact power consumption of home appliances at any given point in time. With the inventive approach, one can produce individual appliance consumption data in a period of time where no event occurred (no change in appliances on/off states) while, in addition, one can provide prediction on the on/off event if the algorithm switched to the high frequency approach.

Figure 3:
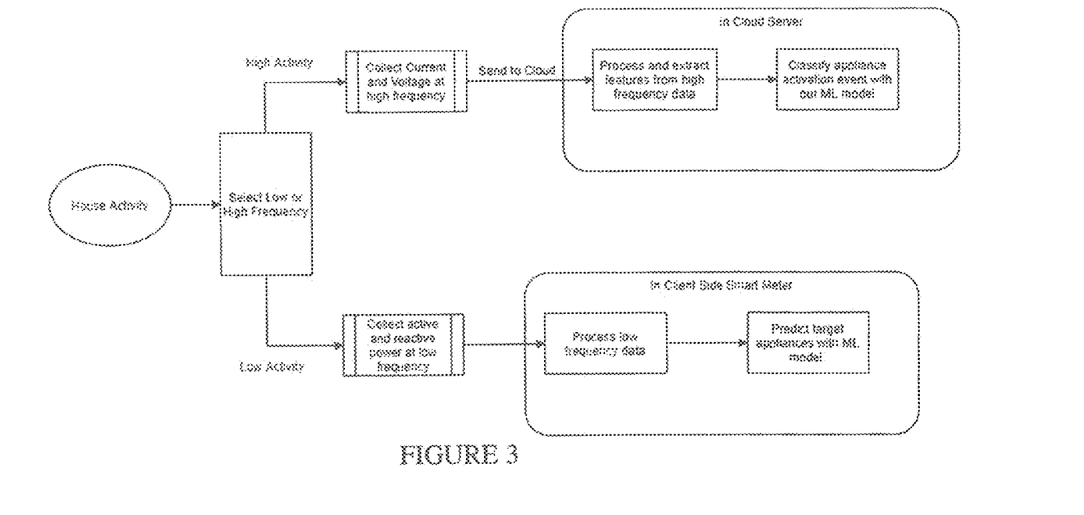
FIG. 3 shows a functional flow diagram of the data collection and processing method proposed by this invention.

FIG. 3 presents the work flow for the inventive system and process. In operation, the building (e.g., house, apartment, office, school, or other structure to be monitored) activity is determined by suitable means at 10. As discussed above, this can be based on the time of day, the number of people in the structure, the number of appliance events detected in a window, and by other means and by combinations of events. At decision block 12, it is determined whether or not there is high activity or low activity in the building. Thresholds can be set for both high activity and low activity, and these thresholds may be adjusted. If it is determined there is low activity in the building, data (e.g., active and reactive power, etc.) is collected at low frequency at block 14. This data is processed and predictions are made with the client side smart meter 16. Conversely if it is determined there is high activity in the building, data (e.g., current and voltage, etc.) is collected at high frequency at block 18. Features are extracted from the data at a cloud server 20 and classifications are made.

Processing low frequency data at the client side smart meter 16 can be performed by a variety of techniques. Good results may be achieved following the model described in Zhang et al., wherein a modified convolutional neural network is used to predict the exact power consumption data of an appliance for a given time frame. The CNN model may use a sequence of data obtained from monitoring low frequency data on the client side to predict the midpoint consumption data of the target appliance. The model will slide over the data to get the complete sequence of the target appliance. The accuracy (in terms of mean absolute error) of the low frequency CNN model used against other approaches can be seen in Table 2 and an example of predicted versus true sequence output by the different models can be seen in FIG. 4.

TABLE 2

Results of Low Frequency Sequence to Point CNN Model in
Terms of Mean Absolute Error Compared to Other Approaches

| Appliance | Denoise AutoEncoder [1] | LSTM RNN [1] | GRU RNN [1] | Sequence to Point CNN [2] |
|---|---|---|---|---|
| Microwave | 26.39 | 42.04 | 34.58 | 13.15 |
| Dishwasher | 51.02 | 90.76 | 62.77 | 9.93 |

Figure 4:
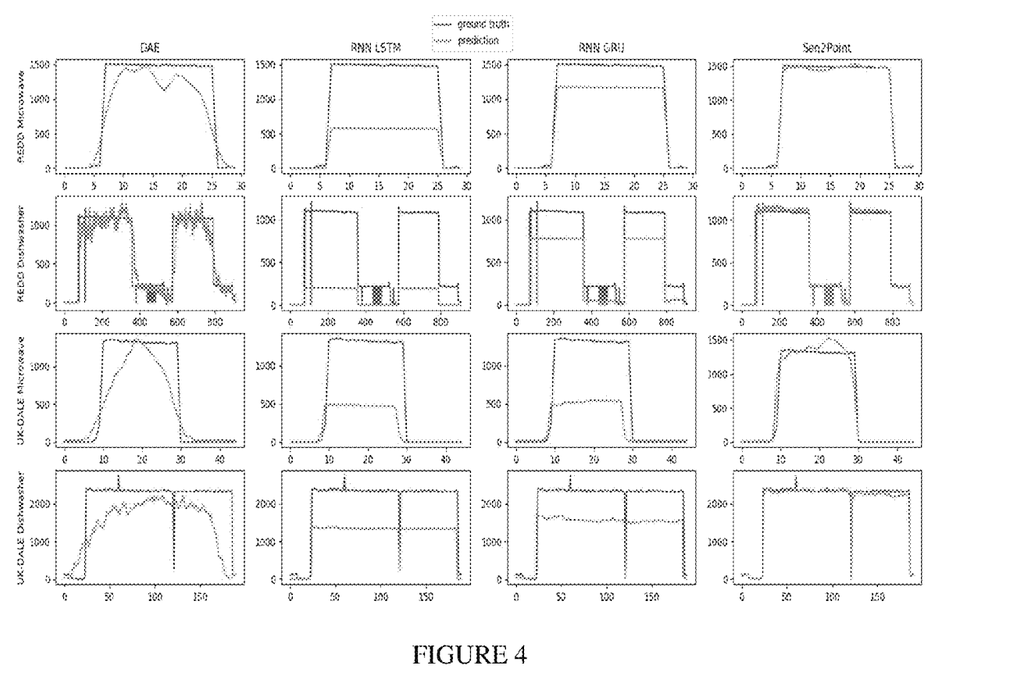
FIG. 4 are graphs showing, for a dishwasher and a microwave, the accuracy of predicting power consumption with a sequence CNN compared to other methods.

FIG. 4 provides a number of graphs which showcase of the accuracy of the used sequence to point model in predicting the power consumption sequence of an appliance compared to other approaches.

Figure 5:
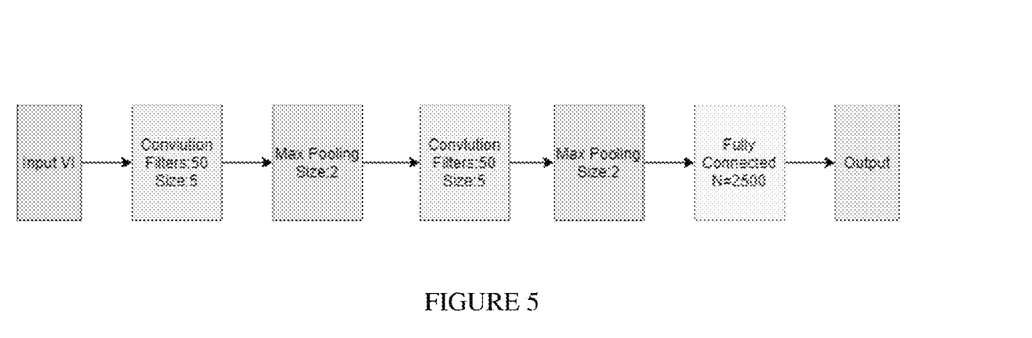
FIG. 5 is a schematic showing the CNN architecture for classifying appliances using high frequency VI trajectory.

Processing high frequency data at the cloud server 20 can be performed by a number of techniques discussed above. Good results may be achieved with a deep learning classifier, i.e. CNN. The deep learning model takes the VI trajectory extracted from the high frequency data and produces predictions on which appliance corresponds to the given data. Models like this are complex and process an enormous amount of data, therefore, these types of models are best deployed in cloud back-end server. VI trajectory is a wave-shape feature that is based on the mutual trajectory of instantaneous voltage and current wave-forms, it can be seen in FIG. 2 (discussed above). We use VI trajectory as weighted pixelated VI images. This approach is straightforward as no need to calculate other features of the VI trajectory. The overall block diagram of a suitable CNN model can be seen in FIG. 5. With this approach we can achieve an F-Score of 77.60%.

Figure 6:
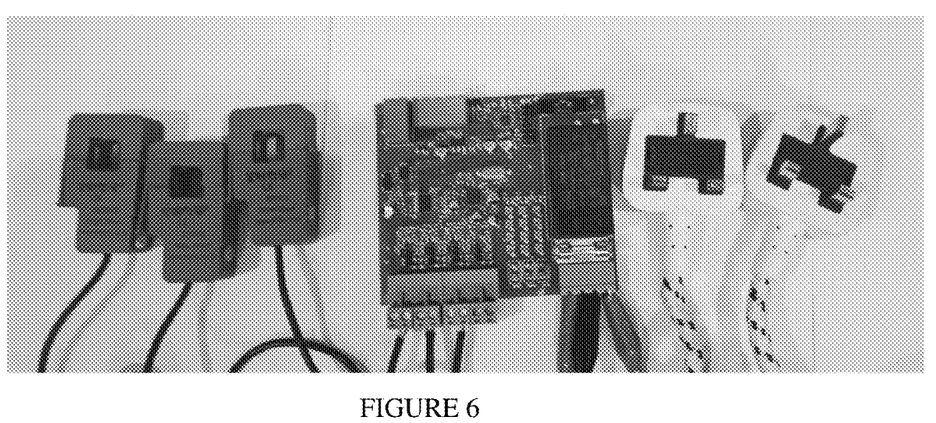
FIG. 6 is a picture showing an exemplary circuitry used for data collection.
Figure 7:
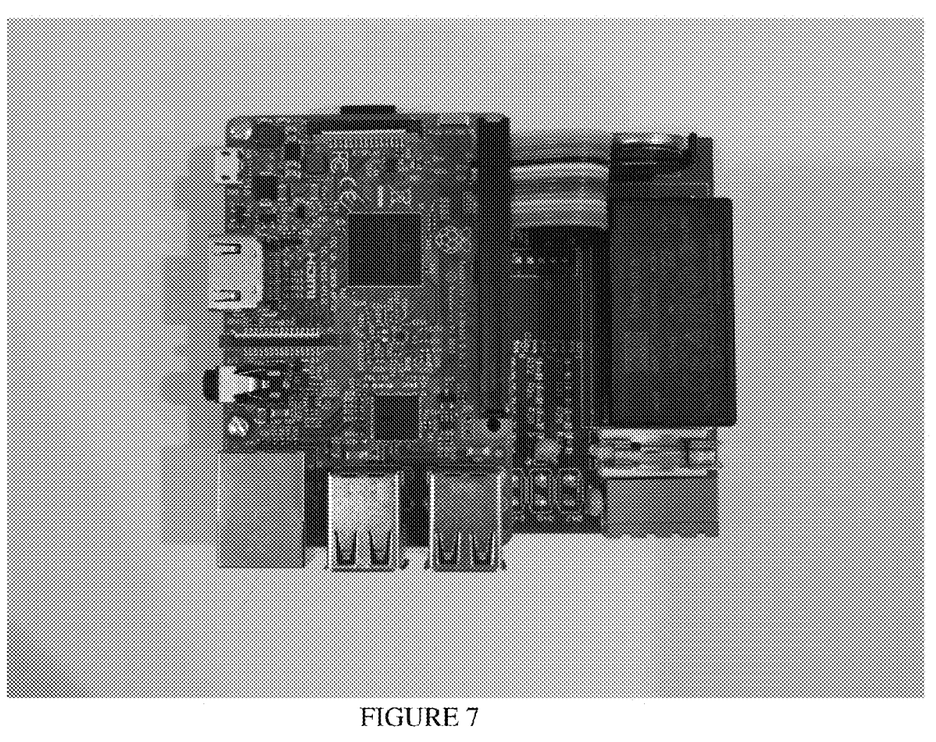
FIG. 7 is a picture showing an exemplary smart meter circuit used for data collection and data handling.

Circuitry used for data collection and handling can vary widely. In an exemplary embodiment the circuitry includes two parts such as is shown in FIGS. 6 and 7. FIG. 6 shows ENSERVE SMARTPI 2.0 for data collection. The collected data will be sent to the cloud server using a RASPBERRY PI 3.0. As shown in FIG. 7, both the ENSERVE SMARTPI 2.0 and the RASPBERRY PI 3.0 can be combined.

The different parts of the circuitry and their functionality are discussed below.

1. The data collection circuit can use a polyphase multifunction energy metering IC with harmonic monitoring of the ANALOG DEVICE ADE7878. The IC is highly programmable and it:
    Supports IEC 62053-21, IEC 62053-22, IEC 62053-23, EN 50470-1, EN 50470-3, ANSI C12.20, and IEEE1459 standards
    Supports IEC 61000-4-7 Class I and II accuracy specification
    Compatible with 3-phase, 3-wire or 4-wire (delta or wye), and other 3-phase services
    Supplies rms, active, reactive and apparent powers, power factor, THD, and harmonic distortion of all harmonics within 2.8 KHz pass band on all phases
    Supplies rms and harmonic distortions of all harmonics within 2.8 KHz pass band on neutral current
2. The data collection circuit is is responsible for:
    Choosing between the high frequency and low frequency modes.
    Data handling
    Date sending to the cloud
    Controlling the IoT devices through the Wi-Fi router
    Controlling a Secure communication between the user's mobile app, the cloud and the smart meter circuit.

Figure 8:
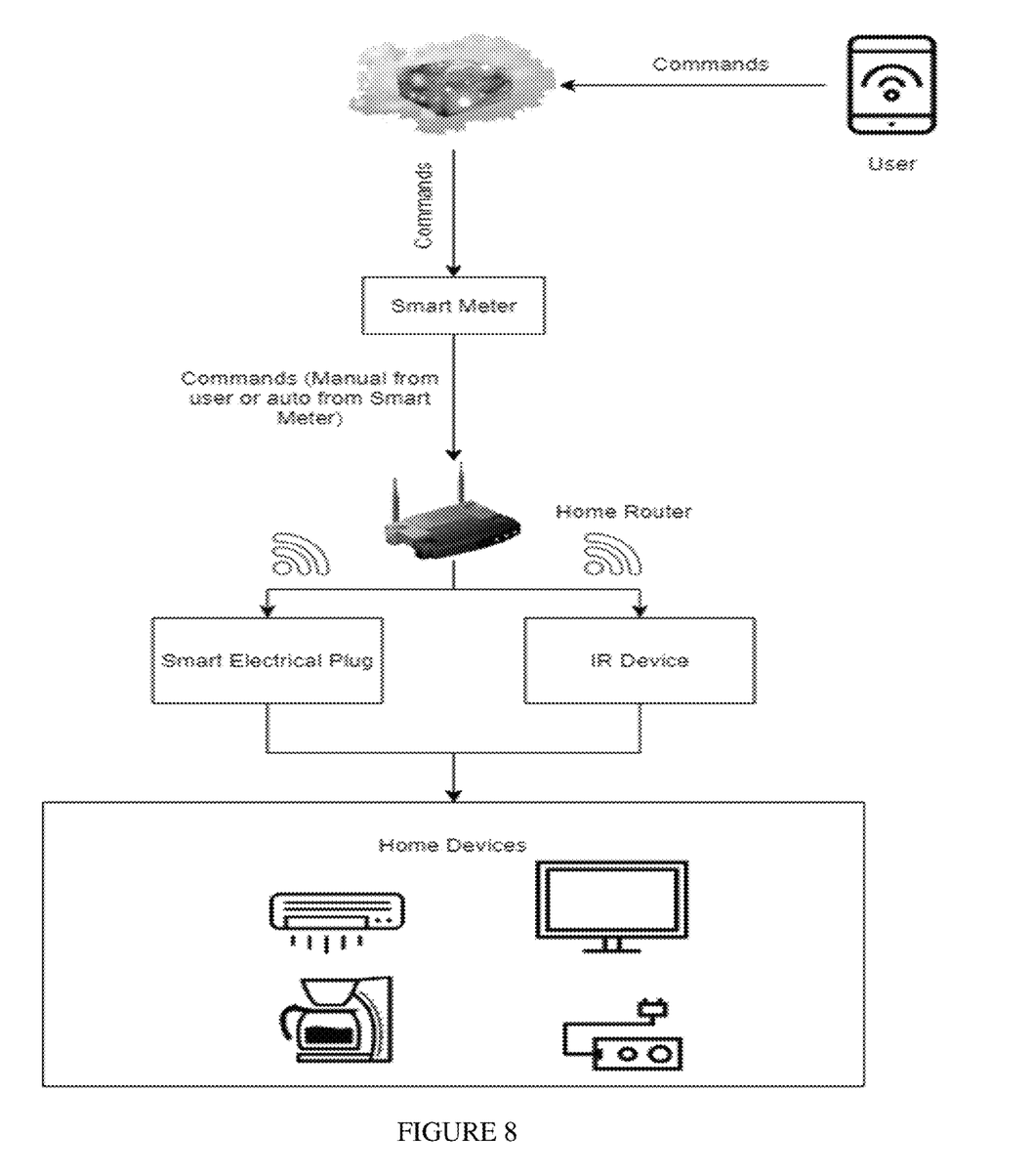
FIG. 8 shows a schematic diagram of the apparatus proposed by this invention and the connections between its parts.

FIG. 8 shows an arrangement where the smart meter 50 of the present invention is connected to the cloud 52 for transmitting high frequency data for back end processing, and to individual devices 54 in the building via a router 56. As discussed above, low frequency data may be processed at the smart meter 50, while in times of high activity, high frequency data is processed in the cloud 52. The arrangement also provides the advantage of allowing a device 58, such as a cell phone or tablet, to wirelessly and from a remote location control individual devices 54 within the building. The device 58 will connect with the smart meter 50 through the cloud 52, and the smart meter can then provide instructions to individual devices 54, e.g., turn on coffee machine, turn on television or record a show, etc.

The invention claimed is:

1. An apparatus for monitoring power consumption of individual appliances in a building, comprising:
    a smart meter circuit configured for measuring and collecting power level data across three electrical supply phases and compatible with three-phase services; and
    a control circuit configured for
        data handling,
        sensing an activity level in said building,
        switching between high frequency sampling and low frequency sampling modes based on a sensed activity level in said building, and
        sending data to a cloud based server,
    wherein said control circuit is configured to switch to high frequency sampling when the sensed activity level is above a specified threshold, and wherein high frequency data sampled during high frequency sampling has extractable voltage current (VI) trajectory data, and
    wherein said control circuit is configured to switch to low frequency sampling when the sensed activity level is below said specified threshold, and wherein said power level data is measured and collected during said low frequency sampling,
    wherein said activity level sensed is based on all of a number of appliance events in a window of time, a number of occupants in the building during a sensing period, and a time of day,
    wherein the window of time, the sensing period, and the time of day, may be the same or different.

2. The apparatus of claim 1 wherein detection of the number of occupants is performed using a wireless network which communicates with mobile phones carried by individual occupants.

3. The apparatus of claim 1 wherein said control circuit is configured for
    connecting to a WI-FI router,
    controlling one or more devices connected to said WI-FI router, and
    controlling a secure communication between a mobile application,
    the cloud based server, and the smart meter circuit.

4. A method for monitoring power consumption of individual appliances in a building, comprising:
    sensing an activity level in said building;
    using a control circuit to switch between high frequency sampling and low frequency sampling modes based on the sensed activity level, wherein said high frequency sampling is performed when the activity level in said building is above a specified threshold and wherein said low frequency sample is performed when the activity level in said building is below said specified threshold;
    wherein said activity level sensed is based on all of a number of appliance events in a window of time, a number of occupants in the building during a sensing period, and a time of day, wherein the window of time, the sensing period, and the time of day may be the same or different;

sending high frequency data sampled during said high frequency sampling mode to a cloud based service for analysis, wherein said high frequency data has extractable voltage current (VI) trajectory data; and using a smart meter circuit compatible with three-phase services to measure and collect power level data across three electrical supply phases during low frequency sampling.

5. A method of learning the energy consumption signatures of individual appliances in a building, comprising:

determining an activity level in the building by each of measuring a number of appliance activation or deactivation events over a given time, measuring a number of occupants of the building during the given time, and using a machine learning algorithm to identify high activity times of day;

switching, based on a specified activity threshold, between sampling power consumption at a high frequency during periods of high activity in the building, and sampling power consumption at a low frequency during periods of low activity in said building;

receiving, during sampling power consumption at said high frequency, at a cloud based server high frequency sampling data;

processing at said cloud based server said high frequency sampling data with a convolutional neural network to disaggregate energy consumption signatures of individual appliances;

receiving, during sampling power consumption at said low frequency, at a client side smart meter the low frequency sampling data; and processing at said client side smart meter said low frequency sampling data with a convolutional neural network to predict a midpoint energy consumption of individual appliances.

6. The method of claim 5 wherein said processing at said cloud base server includes extracting voltage current (VI) trajectory data from said high frequency sampling data.

* * * * *